(12) United States Patent
Lloyd et al.

(10) Patent No.: US 8,248,151 B2
(45) Date of Patent: Aug. 21, 2012

(54) APPARATUS AND METHOD CONFIGURED TO PROVIDE ELECTRICAL BIAS

(75) Inventors: Jennifer Lloyd, North Andover, MA (US); Kimo Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 78 days.

(21) Appl. No.: 12/862,171

(22) Filed: Aug. 24, 2010

(65) Prior Publication Data
US 2012/0049941 A1    Mar. 1, 2012

(51) Int. Cl.
*G05F 1/10* (2006.01)
(52) U.S. Cl. ......................... 327/534; 327/538
(58) Field of Classification Search .................. 327/530, 327/534, 535, 537, 538, 543
See application file for complete search history.

(56) References Cited

U.S. PATENT DOCUMENTS

| | | | |
|---|---|---|---|
| 6,154,083 A * | 11/2000 | Gaudet et al. | 327/312 |
| 6,456,166 B2 * | 9/2002 | Yabe | 331/34 |
| 6,535,039 B2 * | 3/2003 | Nanba et al. | 327/170 |
| 6,954,110 B2 * | 10/2005 | Li | 331/57 |
| 7,746,160 B1 * | 6/2010 | Raghavan et al. | 327/534 |

* cited by examiner

*Primary Examiner* — Jeffrey Zweizig
(74) *Attorney, Agent, or Firm* — Knobbe, Martens, Olson & Bear LLP

(57) ABSTRACT

As provided herein, in some embodiments, power consumption and/or chip area is reduced by bias circuits configured to provide bias conditions for more than one active circuit, thereby reducing the number of bias circuits in a design. Shared bias circuits may reduce the aggregate amount of on-chip area utilized by bias circuitry and may also reduce the total power consumption of a chip. Additionally and/or alternatively, bias circuits disclosed herein are configured to provide outputs that are less susceptible to changes in the voltage supply level. In particular, in some embodiments, bias circuits are configured to provide relatively constant bias conditions despite changes in the voltage supply level. A bias circuit arrangement with an output substantially decoupled from changes in the voltage supply level may provide a more stable operating point in an active circuit. In some embodiments, bias circuits are configured to provide bias conditions that compensate for perturbations caused by changes other inputs, in order to stabilize a particular operating point.

28 Claims, 10 Drawing Sheets

APPARATUS AND METHOD CONFIGURED TO PROVIDE ELECTRICAL BIAS

BACKGROUND

1. Field

Embodiments of the invention relate to electronic devices, and more particularly, in one or more embodiments, to configurations of bias circuits.

2. Description of the Related Technology

Biasing is a method of establishing particular electrical conditions at various points in an electronic circuit in order to set a desired operating point for one or more electronic devices included in the circuit. In particular, biasing is typically used to set and control a desired operating point for an active electronic device, such as a transistor. For example, a transistor can be controlled to provide various functions, at respective operating points, by establishing particular direct current (DC) bias conditions at the terminals of the transistor.

Bias conditions are commonly generated within the immediate vicinity of the active circuit and/or active device in need of biasing. In an effort to reduce component count and size a bias circuit is often integrated into the design of an active circuit. As a result, an active circuit is typically provided together with a respective custom bias circuit.

On an integrated circuit (IC) die or chip, the available space for circuits is limited. There is also a commercial preference to maintain or reduce the size of chips in order to increase semiconductor manufacturing yield, even as transistor density increases. Bias circuits detract from the amount of space available for the active circuits that perform the desired functions a chip has been designed for. Bias circuits also consume power that contributes to the heating of a chip, which can lead to performance degradation and even failure. Accordingly, as the demand for on-chip functionality increases, there lies a challenge to implement more complex circuits that consume less power and occupy less on-chip area.

Bias circuits are also typically designed with passive electronic elements in order to minimize the amount of power consumed. However, the output of a passive bias circuit will almost always change in response to changes in the voltage supply level. Such changes will in turn change the operating point of the active circuit receiving the bias. For example, the output of an amplifier may lose dynamic range (i.e. amplitude compression) if a bias voltage decreases in response to a decrease of the voltage supply level. One known solution to this problem is to provide a number of respective bias circuits that provide respective outputs that can be selectively coupled to an amplifier to produce the desired operation. The range of operating conditions over which this technique is useful is limited by the number of bias circuits that are provided. However, each additional bias circuit takes up additional space, which can be undesirable for on-chip applications, where die area is relatively expensive.

SUMMARY

Various embodiments of systems, methods and devices within the scope of the appended claims each have several aspects, no single one of which is solely responsible for the desirable attributes described herein. Without limiting the scope of the appended claims, some prominent features are described herein. After considering this discussion, and particularly after reading the section entitled "Detailed Description" one will understand how the features of various embodiments are used to configure bias circuits that are less susceptible to changes in supply levels and/or can be used to bias more than one active circuit, thereby reducing the amount of bias circuitry needed for a particular design.

One aspect of the disclosure is an apparatus configured to generate a bias for an electronic circuit. In one embodiment, the apparatus includes a first circuit configured to contribute to the biasing of a second circuit, the first circuit operatively coupled to a first bias node as a reference for biasing of a second bias node of the second circuit, the first circuit having an output configured to generate a first electrical output; an error detection circuit configured generate an error signal based at least partly on an electrical reference and the first electrical output of the first circuit; a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal; and a second controllable electrical source operatively coupled between the error detection circuit and the second circuit, the second controllable electrical source configured to receive the error signal as a control input and to generate a second electrical output, wherein the second electrical output is generated at least partly in response to the error signal.

Another aspect of the disclosure is a method of generating a bias for an electronic circuit. In one embodiment, the method includes generating a first electrical output from a first circuit; generating an error signal based at least partly on a comparison between the first electrical signal and an electrical reference; generating a first bias by providing the error signal as a control input to a first controllable source; applying the first bias to a bias node of the first circuit; generating a second bias by providing the error signal as a control input to a second controllable source; and applying the second bias to a bias node of a second circuit for biasing of the second circuit.

DETAILED DESCRIPTION

The various embodiments of systems, methods, and devices described herein each have several aspects, no single one of which is solely responsible for the desirable attributes described. Without limiting the scope of the claims, the more prominent features of various embodiments are described below. After considering the following one skilled in the art will understand how the features of the various embodiments provide advantages over previously available bias circuits.

Figure 1A:
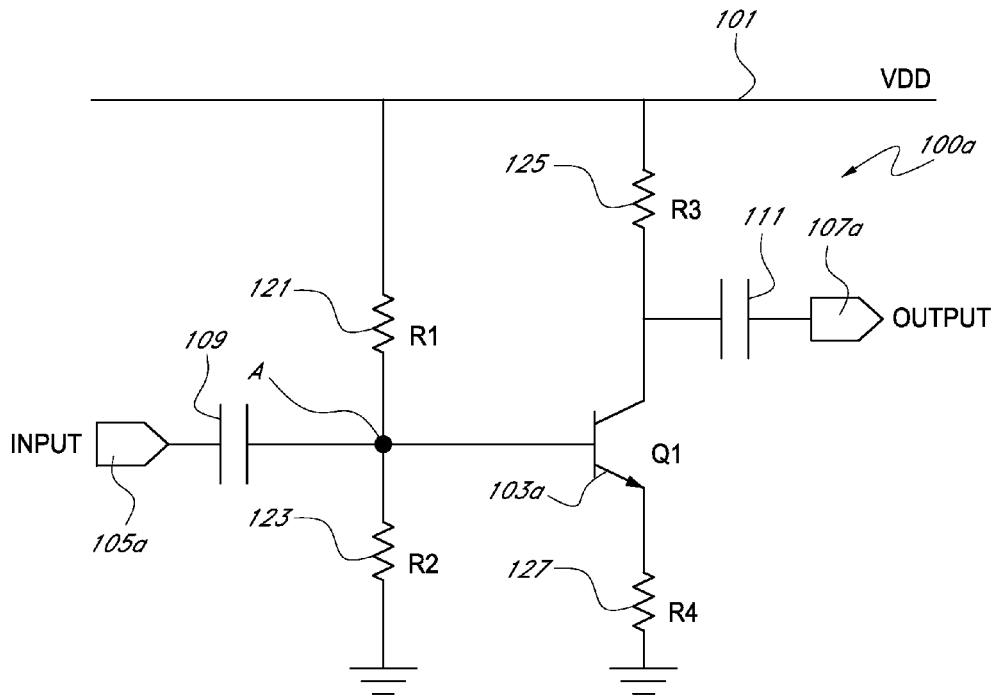
FIG. 1A is a schematic circuit diagram including an integrated bias circuit.

FIG. 1A is a schematic circuit diagram of a common-emitter amplifier 100a including an integrated bias circuit. The common-emitter amplifier 100a includes a bipolar junction transistor (BJT) 103a and resistors 125 and 127, having respective values represented by R3 and R4. Those skilled in the art will appreciate that the voltage gain for the common-emitter amplifier 100a is approximated as the ratio R3/R4 of the resistors 125 and 127. The bias circuit includes the resistor 127 and a voltage divider including resistors 121 and 123 connected in series between the voltage supply 101 and ground. The resistors 121 and 123 are connected at node A, which is also connected to the base terminal of the BJT 103a. The resistors 121 and 123 have respective values represented by R1 and R2.

In operation, the voltage divider provides a DC bias voltage $V_{REF}$ at node A, which is approximately equal to $V_{DD}*R2/(R1+R2)$. In other words, $V_{REF}$ is a function of the voltage supply level $V_{DD}$. The DC bias voltage $V_{REF}$ contributes to setting the voltage across the base-emitter junction of the BJT 103a. The resistor 127, in addition to being involved in setting the analog small-signal voltage gain, provides negative feedback that stabilizes the DC bias conditions for the BJT 103a.

Additionally, the common-emitter amplifier 100a includes a first alternating current (AC) coupling capacitor 109 that is connected between the input 105a and node A. Similarly, a second AC coupling capacitor 111 is connected between the collector of the BJT 103a and the output 107a. The first and second coupling capacitors 109, 111 are provided to allow AC signals to pass to and from the BJT 103a while keeping the DC bias circuit isolated. As such, the first and second coupling capacitors 109, 111 support stability of the desired operating point created by the DC bias circuit.

However, the bias circuit is not isolated from the voltage supply 101. Changes in the voltage supply level $V_{DD}$ will change the bias voltage $V_{REF}$, since $V_{REF}$ is a direct function of $V_{DD}$ through the voltage divider. For example, the bias voltage $V_{REF}$ will decrease is response to a decrease in the voltage supply level $V_{DD}$. In turn the operating point of the BJT 103a may change causing amplitude compression (i.e. loss of dynamic range), or non-linear distortion if the bias changes so that the BJT 103a shifts from active to saturation mode. Thus, this type of integrated bias circuit is less preferred for applications where the voltage supply level is variable, such as for driver circuits in high-speed serial data transmitters.

Figure 1B:
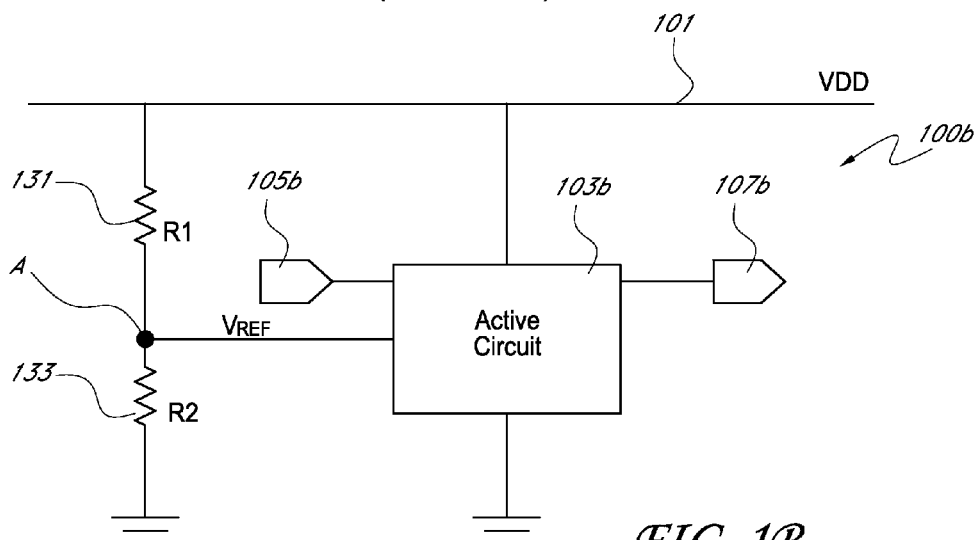
FIG. 1B is a schematic circuit diagram including a bias circuit configured to provide a voltage bias to an active circuit.

FIG. 1B is a schematic circuit diagram of a circuit 100b provided with a bias circuit configured to provide a voltage bias. The circuit 100b includes an active circuit 103b. The active circuit 103b includes an input 105b and an output 107b. In operation, the active circuit 103b utilizes a voltage bias $V_{REF}$ in order to achieve an operating point. To that end, the circuit 100b includes a voltage divider including resistors 131 and 133, which have respective values represented by R1 and R2. As described above with reference to FIG. 1A, the voltage divider provides a DC bias voltage $V_{REF}$ at node A that is approximately equal to $V_{DD}*R2/(R1+R2)$. Again, the problem with this biasing arrangement is that $V_{REF}$ closely tracks the up and down movement of $V_{DD}$.

Figure 1C:
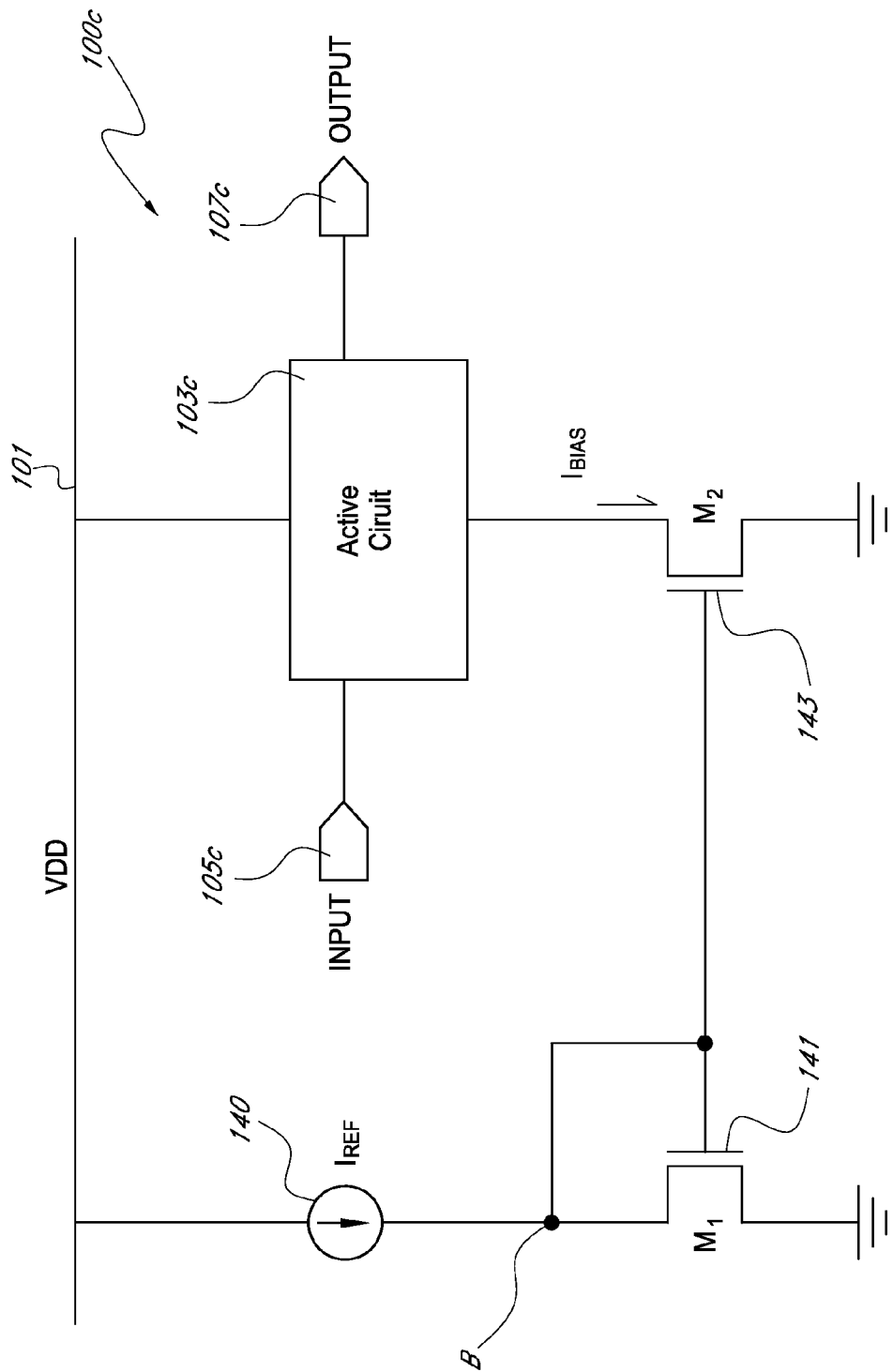
FIG. 1C is a schematic circuit diagram including a bias network configured to provide a current bias to an active circuit.

FIG. 1C is a schematic circuit diagram of a circuit 100c provided with a bias network configured to provide a current bias. The circuit 100c includes an active circuit 103c. The active circuit 103c includes an input 105c and an output 107c. In operation, the active circuit 103c utilizes a current bias $I_{NAS}$ in order to achieve an operating point. To that end, the current bias $I_{BIAS}$ is provided by a current mirror. The current mirror includes first and second NMOS transistors 141, 143 and a current source 140. The current source 140 is coupled between the voltage supply 101 and the drain of the first transistor 141. The drain of the first transistor is also referenced as node B. The drain of the first transistor 141 is also coupled to the gate of the first transistor 141, and the source of the first transistor 141 is coupled to ground. The gate of the first transistor 141 is also coupled to the gate of the second transistor 143. The drain of the second transistor 143 is coupled to the active circuit 103c, and the source of the second transistor 143 is coupled to ground.

In operation, the voltage developed at node B is applied to the gate of the second transistor causing the second transistor to draw the current bias $I_{BIAS}$ from the voltage supply 201 through the active circuit 103c, thereby biasing the active circuit 103a. The current bias $I_{BIAS}$ is approximately equal to the current $I_{REF}$ provided by the current source 140. For some current source designs, the current $I_{REF}$ is a function of the voltage supply level $V_{DD}$, meaning that changes in the voltage supply level will directly impact the current $I_{REF}$ and in turn the bias current $I_{BIAS}$. Changes to the bias current $I_{BIAS}$ will in turn change the operating point of the active circuit 103c.

For other current source designs, the reference current $I_{REF}$ is relatively less susceptible to changes in the voltage supply level $V_{DD}$. Nevertheless, the bias conditions at node B remain susceptible to changes in the voltage supply level $V_{DD}$. For example, with continued reference to FIG. 1C, the voltage at the drain of transistor M2 decreases in response to decreases in the voltage supply level $V_{DD}$, even though reference current $I_{REF}$ may remain relatively unchanged. Consequently, the mode of operation of transistor M2 will transition to the less preferred triode mode of operation from the preferred saturation mode of operation for this arrangement. By contrast, the transistor M1 will remain in the preferred saturation mode of operation because the voltage at the drain of transistor M1, and thus voltage reference $V_{REF}$, will not significantly change because the reference current $I_{REF}$ remains stable despite changes in the voltage supply level $V_{DD}$. Accordingly, despite providing a relatively stable current reference $I_{REF}$, the bias conditions applied to the active circuit 103c via node B remain adversely susceptible to changes in the voltage supply level $V_{DD}$.

The circuits 100a, 100b and 100c help illustrate that bias conditions are commonly generated within the immediate vicinity of an active circuit and/or active device in need of biasing. Additionally, in an effort to reduce component count and size a bias circuit is often integrated into the design of an active circuit. Thus, an active circuit is typically provided together with a respective custom bias circuit. For example, with reference to FIG. 1A, the resistor 127 contributes to both stabilizing DC bias conditions and setting the small-signal voltage gain of the common-emitter amplifier 100a. An active circuit designed in this way cannot be easily separated from the bias circuit, because elements of the bias circuit have dual roles as elements of both the bias circuit and the active circuit.

Consequently, each common-emitter amplifier included in a design will include a respective bias circuit.

On an integrated circuit (IC) die or chip, the available space for circuits is limited. There is also a general commercial preference to maintain or reduce the size of chips in order to increase semiconductor manufacturing yield, even as transistor density increases. Bias circuits detract from the amount of space available for the active circuits that perform the desired functions a chip has been designed for. Bias circuits also consume power that contributes to the heating of a chip, which can lead to performance degradation and even failure. Accordingly, as the demand for on-chip functionality increases, there lies a challenge to implement more complex circuits that consume less power and occupy less on-chip area.

The circuits 100a, 100b and 100c also help illustrate that the electrical outputs of conventional bias circuits are typically a function of the voltage supply level $V_{DD}$, and will thus change in response to changes in the voltage supply level $V_{DD}$. As described above with reference to FIG. 1A, such changes will in turn change the operating point of the active circuit that a bias circuit is provided to bias. Accordingly, there lies a challenge to provide a biasing scheme that is less susceptible to changes in the voltage supply level.

As provided herein, in some embodiments, power consumption and/or chip area is reduced by bias circuits configured to provide bias conditions for more than one active circuit, thereby reducing the number of bias circuits in a design. That is, some embodiments of bias circuits disclosed herein are configured to be shared by two or more active circuits. In some embodiments, shared bias circuits may reduce the number of bias circuits needed to bias a number of active circuits, and thereby reduce the aggregate amount of on-chip area utilized by bias circuitry. In some embodiments, shared bias circuits may reduce the total power consumption of a chip. Additionally and/or alternatively, in some embodiments, bias circuits disclosed herein are configured to provide outputs that are less susceptible to changes in the voltage supply level. In particular, in some embodiments, bias circuits are configured to provide relatively constant bias conditions despite changes in the voltage supply level. In some embodiments, a bias circuit arrangement with an output substantially decoupled from changes in the voltage supply level may provide a more stable operating point in one or more active circuits. In some embodiments, bias circuits are configured to provide bias conditions that compensate for perturbations caused by changes in the voltage supply level or other inputs, in order to stabilize a particular operating point for an active circuit.

Figure 2A:
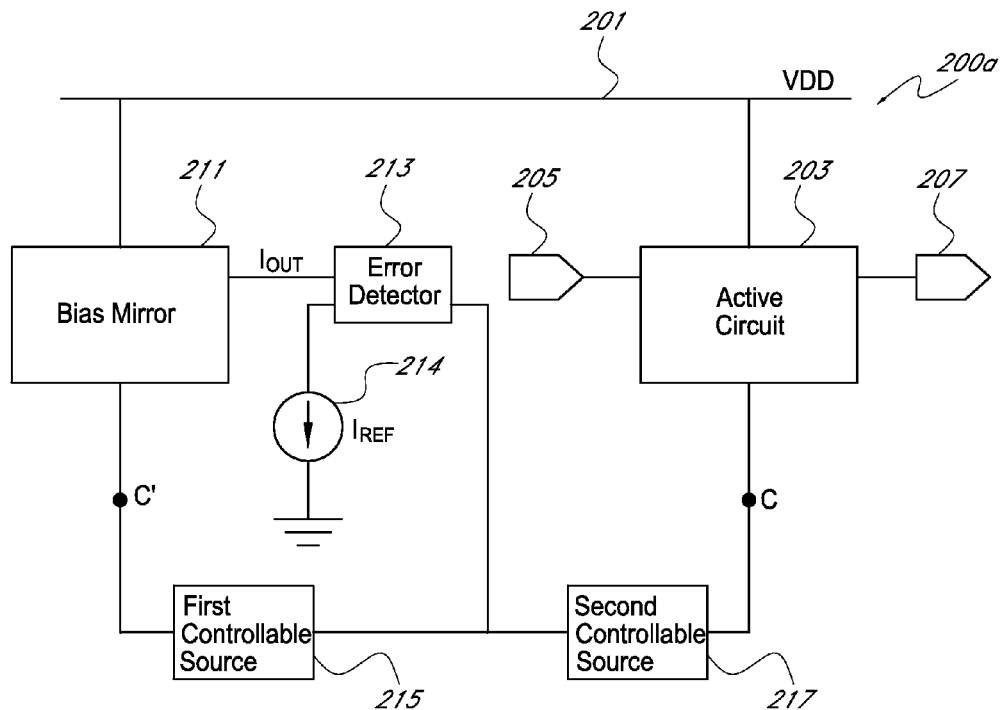
FIG. 2A is a block diagram of one embodiment of a bias circuit arrangement.

FIG. 2A is a block diagram of one embodiment of a bias circuit 200a in combination with an active circuit 203. Those skilled in the art will appreciate that a circuit typically includes more features than are illustrated in FIG. 2A. For the sake of brevity, only the more prominent features useful for describing various aspects of embodiments of systems, methods and devices within the scope of the appended claims are illustrated.

The active circuit 203 includes an input 205, an output 207, and a bias node C. The bias node C is configured to receive a current bias $I_{BIAS}$ and/or a voltage bias $V_{BIAS}$ which is produced by the bias circuit 200a.

The bias circuit 200a has a feedback loop configuration including a bias mirror 211, an error detector 213, a fixed current source 214, and a first controllable source 215. The bias circuit 200a also has a second controllable source 217 configured to copy or translate updated bias conditions from the feedback loop to the active circuit 203. The error detector 213 is connected to receive a first electrical output of the bias mirror 211. In the example shown in FIG. 2A, the first electrical output is a current output $I_{OUT}$. Those skilled in the art will appreciate from the disclosure herein that in another embodiment the first electrical output is a voltage output (not shown). The error detector 213 is also connected to receive a reference current $I_{REF}$ produced by the current source 214. Those skilled in the art will appreciate that the current source 214 is provided to provide an electrical reference that is used to generate an error signal (which is described in further detail below). However, in another embodiment, those skilled in the art will also appreciate that a voltage source is usable in place of the current source 214. Moreover, in one embodiment, the electrical reference, whether a current or voltage, is substantially invariable or fixed. In another embodiment the electrical reference is variable in response to a control signal.

The first and second controllable sources 215, 217 are each connected to receive the output of the error detector 213, referred to as an error signal hereinafter. The bias mirror 211 is connected to the voltage supply 201. The bias mirror 211 is also connected to receive the output of the first controllable source 215. The bias mirror 211 includes a bias node C' configured as reference for the bias node C of the active circuit 203. In one embodiment, the bias mirror 211 is further configured to emulate a portion of the active circuit 203 so that the bias node C' is a closer approximation of the bias node C. For example, in one embodiment, the active circuit 203 includes an amplifier and the bias mirror 211 includes a portion of a replica of an amplifier similar to the amplifier included in the active circuit.

In operation, the active circuit 203 utilizes the current bias $I_{BIAS}$ and/or the voltage bias $V_{BIAS}$ in order to achieve an operating point. The bias circuit 200a provides the bias conditions to the active circuit 203. To that end, the bias circuit 200a utilizes the feedback configuration to substantially decouple the bias conditions provided to the active circuit 203 from variations of the voltage supply level $V_{DD}$. This is accomplished by setting and maintaining bias conditions on bias node C' of the bias mirror 211 and copying or translating the bias conditions onto bias node C of the active circuit 203 using the second controllable source 217.

In order to set and maintain the bias conditions on bias node C', the error detector 213 receives the current output $I_{OUT}$ of the bias mirror 211 and the reference current $I_{REF}$ provided by the current source 214. The error detector 213 compares the current output $I_{OUT}$ of the bias mirror 211 and the reference current $I_{REF}$ in order to produce an error signal. In one embodiment, the error signal is a difference between the current output $I_{OUT}$ and the reference current $I_{REF}$. In another embodiment, the error signal is a function of current output $I_{OUT}$ and the reference current $I_{REF}$. In another embodiment, the first electrical output of the bias mirror 211 is a voltage output, and the error signal is a function of voltage output of the bias mirror 211 and the reference current $I_{REF}$. In another embodiment, the error detector circuit 213 is configured to compare two or more voltages. In another embodiment, the error detector circuit 213 is configured to compare one or more currents against one or more voltages.

The error signal is in turn provided to the first and second controllable sources 215, 217. The first controllable source 215 produces an updated bias signal for bias node C' in response to the error signal. The updated bias signal changes the operation of the bias mirror 211, which in turn changes the current output $I_{OUT}$ so that the error signal subsequently produced by the error detector 213 has less of an impact on the first and second controllable sources 215, 217. In this way, the feedback loop of the bias circuit 200b adapts to changes in the voltage supply level in order to substantially maintain the current output $I_{OUT}$ at a predetermined and/or preferred level. In other words the feedback loop servos the bias conditions on the bias mirror 211 so that the bias mirror 211 produces a substantially constant current over a wide range of voltage supply levels $V_{DD}$.

The updated bias conditions applied to bias node C' are copied or translated onto bias node C by the second controllable source 217, which is controlled by the error signal in a manner similar to the first controllable source 215. In other words, the bias conditions applied to bias node C track the bias conditions applied to bias node C'.

In one embodiment, the first and second controllable sources 215, 217 are substantially the same, thereby producing substantially the same bias conditions at respective bias nodes C', C. In another embodiment, the first and second controllable sources 215, 217 are scaled versions of one another, thereby producing substantially the scaled versions of the bias conditions at respective bias nodes C', C. In another embodiment, the first and second controllable sources 215, 217 are different from one another, thereby producing substantially different, but correlated, bias conditions at respective bias nodes C', C.

Figure 2B:
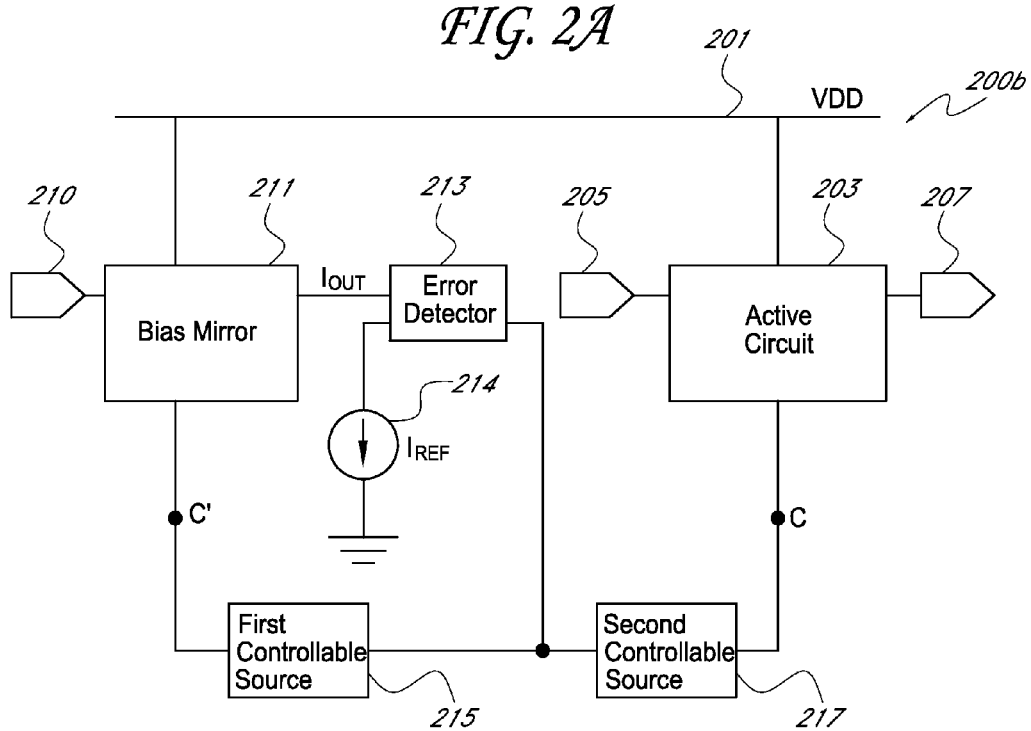
FIG. 2B is a block diagram of another embodiment of a bias circuit arrangement.

FIG. 2B is a block diagram of another embodiment of a bias circuit 200b in combination with the active circuit 203 of FIG. 2A. The bias circuit 200b illustrated in FIG. 2B is similar to and adapted from the bias circuit 200a illustrated in FIG. 2A. Elements common to both bias circuits 200a, 200b share common reference indicia, and only differences between the bias circuits 200a, 200b are described herein for the sake of brevity.

The bias mirror 211 in FIG. 2B further includes an input 210. In one embodiment, the bias mirror 211 has substantially the same configuration of electrical components as the active circuit 203. For example, in one embodiment, the active circuit 203 includes an amplifier and the bias mirror 211 includes a replica of the amplifier. Additionally and/or alternatively, in another embodiment, the bias mirror 211 is a scaled version of the active circuit 203. For example, in one embodiment, the active circuit 203 includes an amplifier and the bias mirror 211 includes a scaled replica of the amplifier.

The operation of the bias circuit 200b illustrated in FIG. 2B is substantially the same as the bias circuit 200a illustrated in FIG. 2A, except that the bias mirror 211 is now provided with an input signal through the input 210. An input signal applied to the input 205 of the active circuit 203 may perturb the DC bias conditions of the active circuit 203. Accordingly, if the same, similar or an approximation of the input signal is applied to the input 210 of the bias mirror 211, the same, similar or an approximation of the perturbation will occur within the bias mirror 211 as occurs in the active circuit 203. The perturbation may in turn have an impact on the current output of the bias mirror 211. Nevertheless, as discussed above, the feedback loop operation of the bias circuit 200b will continuously provide updated bias conditions to bias node C' through the first controllable source 215 that substantially compensate for the perturbation and stabilize the operating point of the bias mirror 211. The continuously updated bias conditions on bias node C' will also be copied or translated to the bias node C through the second controllable source 217, where the bias conditions may substantially compensate for the perturbation caused by the input signal and stabilize the operating point of the active circuit 203.

Figure 3A:
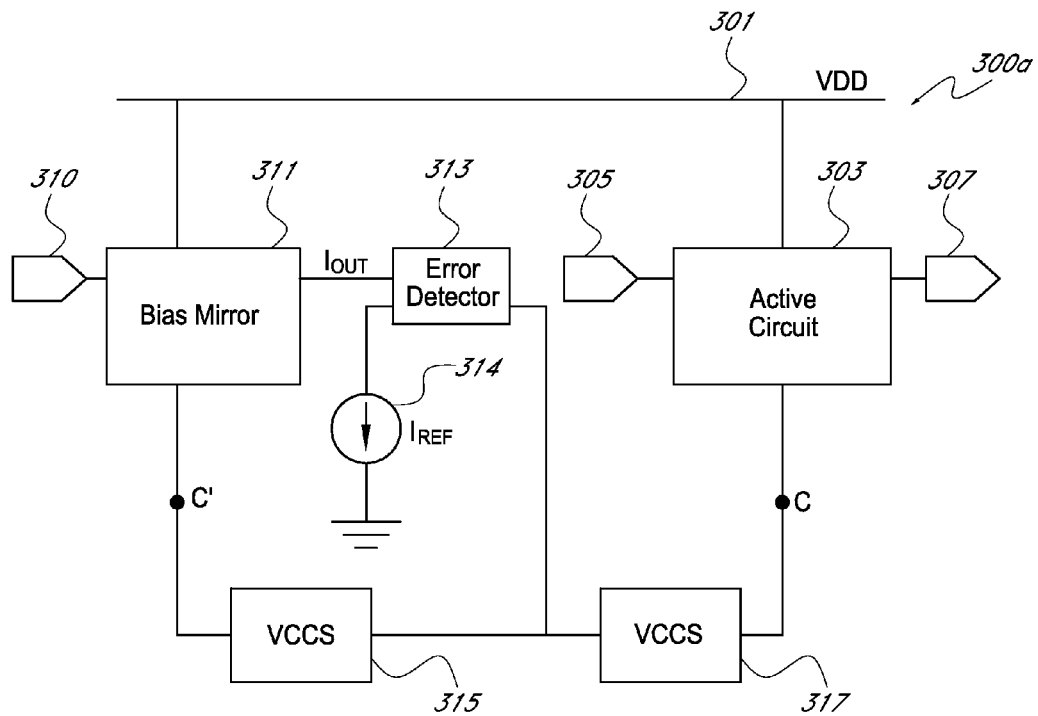
FIG. 3A is a block diagram of another embodiment of a bias circuit arrangement.

FIG. 3A is a block diagram of another embodiment of a bias circuit 300a in combination with the active circuit 203 of FIG. 2A. The bias circuit 300a illustrated in FIG. 3A is similar to and adapted from the bias circuit 200b illustrated in FIG. 2B. Elements common to both bias circuits 200b, 300a share common reference indicia, and only differences between the bias circuits 200b, 300a are described herein for the sake of brevity.

With reference to FIG. 3A, the error signal produced by the error detector 213 is a voltage signal. In turn, the first controllable source 215 of FIG. 2B is configured as a voltage controlled current source 315 in FIG. 3A. Similarly, the second controllable source 217 of FIG. 2B is configured as a voltage controlled current source 317 in FIG. 3A. In another embodiment the first and second controllable sources 215, 217 of FIG. 2B are configured as a current controlled current sources (not shown).

Figure 3B:
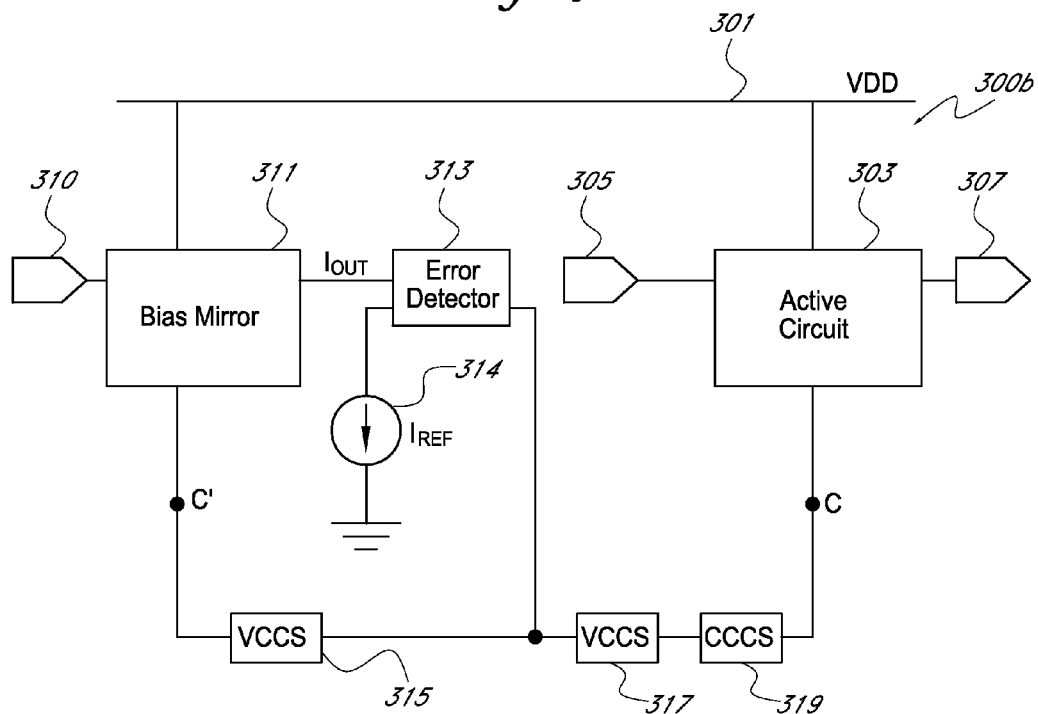
FIG. 3B is a block diagram of another embodiment of a bias circuit arrangement.

FIG. 3B is a block diagram of another embodiment of a bias circuit 300b in combination with the active circuit 203 of FIG. 2A. The bias circuit 300b illustrated in FIG. 3B is similar to and adapted from the bias circuit 300a illustrated in FIG. 3A. Elements common to both bias circuits 300a, 300b share common reference indicia, and only differences between the bias circuits 300a, 300b are described herein for the sake of brevity. Specifically, the bias circuit 300b further includes a first current controlled current source 319 connected between the second voltage controlled current source 317 and the bias node C of the active circuit 203. The first current controlled current source 319 is configured to provide a current output in response to the current output of the second voltage controlled current source 317.

Figure 3C:
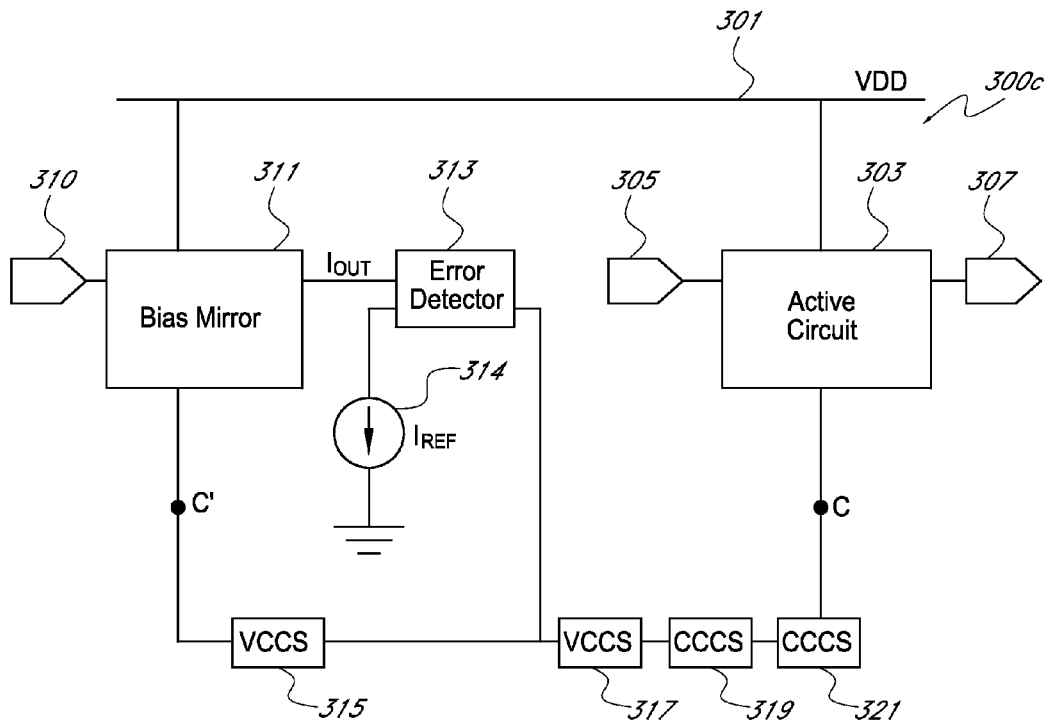
FIG. 3C is a block diagram of another embodiment of a bias circuit arrangement.

FIG. 3C is a block diagram of another embodiment of a bias circuit 300c in combination with the active circuit 203 of FIG. 2A. The bias circuit 300c illustrated in FIG. 3C is similar to and adapted from the bias circuit 300b illustrated in FIG. 3B. Elements common to both bias circuits 300b, 300c share common reference indicia, and only differences between the bias circuits 300b, 300c are described herein for the sake of brevity. Specifically, the bias circuit 300c further includes a second current controlled current source 321 connected between the first current controlled current source 319 and the bias node C of the active circuit 203. The second current controlled current source 321 is configured to provide a current output in response to the current output of the first current controlled current source 319.

Figure 3D:
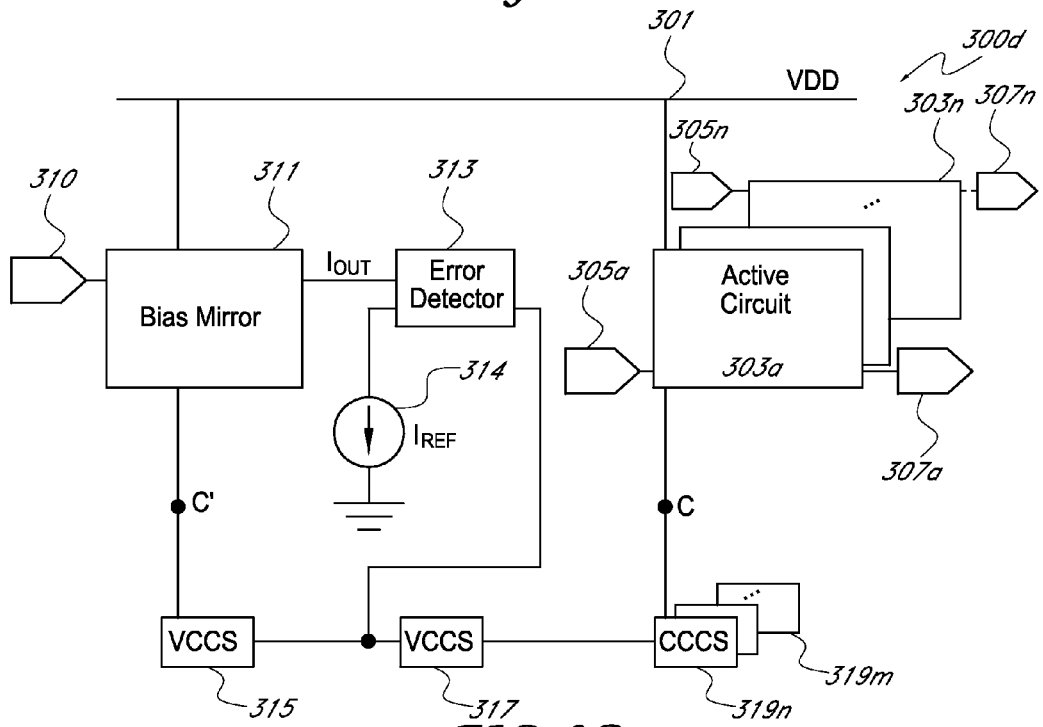
FIG. 3D is a block diagram of another embodiment of a bias circuit arrangement.

FIG. 3D is a block diagram of another embodiment of a bias circuit 300d in combination with a number of active circuits 303a to 303n. The bias circuit 300d illustrated in FIG. 3D is similar to and adapted from the bias circuit 300a illustrated in FIG. 3A. Elements common to both bias circuits 300a, 300d share common reference indicia, and only differences between the bias circuits 300a, 300d are described herein for the sake of brevity. Specifically, the bias circuit 300d further includes a first group of current controlled current sources 319a to 319m. Each of the first group of current controlled current sources 319a to 319m is configured to provide a respective current output in response to the current output of the voltage controlled current source 317. Each current output is provided to at least one of the respective bias nodes of the active circuits 303a to 303n.

The first group of current controlled current sources 319a to 319m allows the circuits of a single feedback loop to provide the bias conditions for two or more active circuits 303a to 303n. In so doing, the amount of bias circuitry needed to bias the active circuits 303a to 303n is substantially reduced as compared to a conventional design, in which each active circuit includes a respective custom bias circuit.

Figure 3E:
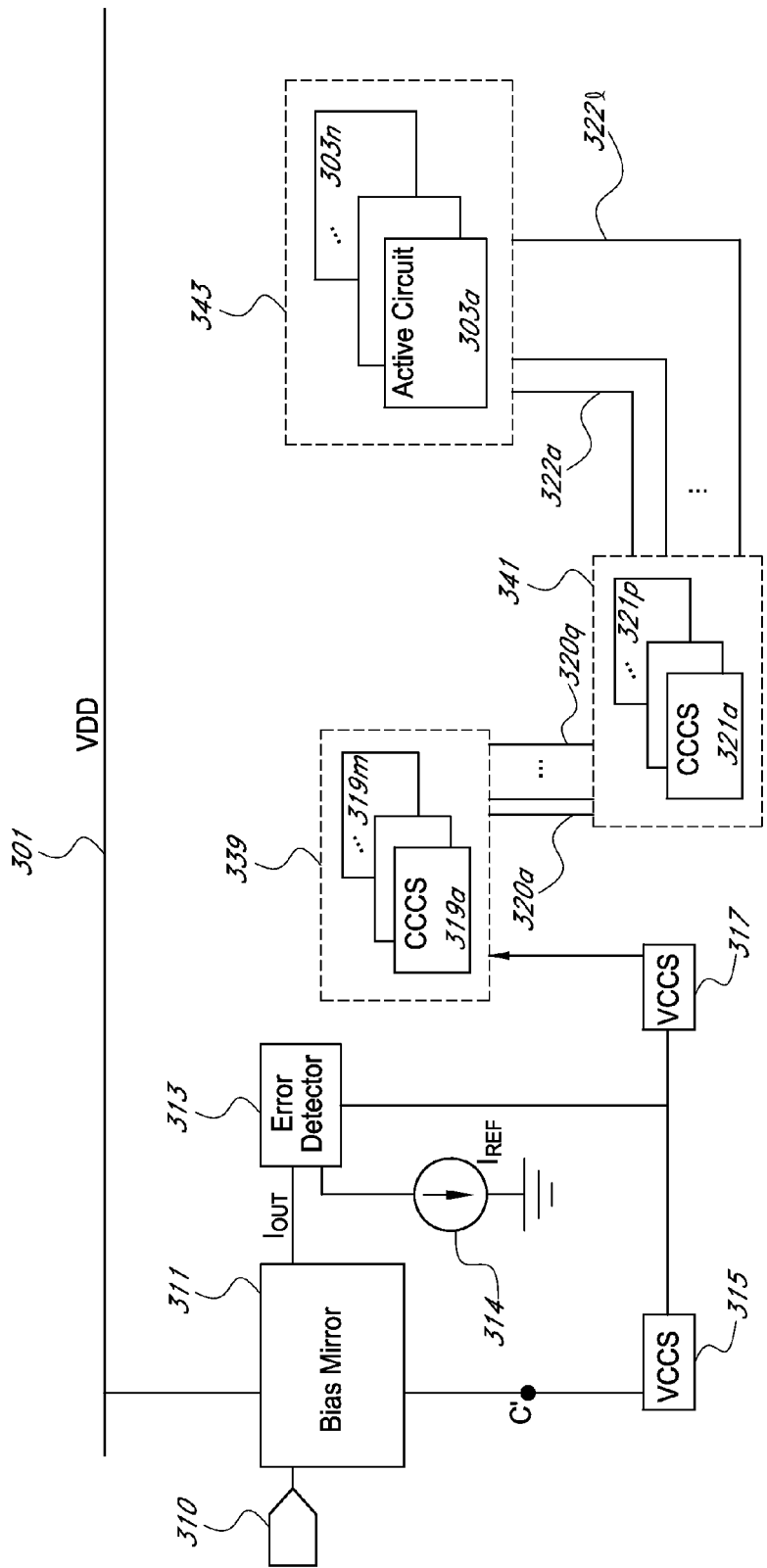
FIG. 3E is a block diagram of another embodiment of a bias circuit arrangement.

FIG. 3E is a block diagram of another embodiment of a bias circuit 300e in combination with a number of active circuits 303a to 303n. The bias circuit 300e illustrated in FIG. 3E is similar to and adapted from the bias circuit 300d illustrated in FIG. 3D. Elements common to both bias circuits 300d, 300e share common reference indicia, and only differences between the bias circuits 300d, 300e are described herein for the sake of brevity. Specifically, the bias circuit 300d further includes a second group of current controlled current sources 321a to 321p, collectively referenced as 341. The first group of current controlled current sources 319a to 319m is also now collectively referenced as 339. Each of the second group of current controlled current sources 341 is configured to provide a respective current output in response to at least one of the current outputs 320a to 320q provided by the first group of current controlled current sources 339. The current outputs of the second group of current controlled current sources 341 are provided to the bias nodes of the active circuits 303a to 303n, collectively referenced as 343.

Together the first and second groups of current controlled current sources 339, 341 further allows fine tuning of the bias conditions applied to the bias node of the active circuits 343. To that end, in one embodiment, at least one of the first group of current controlled current sources 339 can be switched between an activated and deactivated state. Additionally and/or alternatively, in another embodiment, at least one of the second group of current controlled current sources 341 can be switched between an activated and deactivated state.

Figure 4:
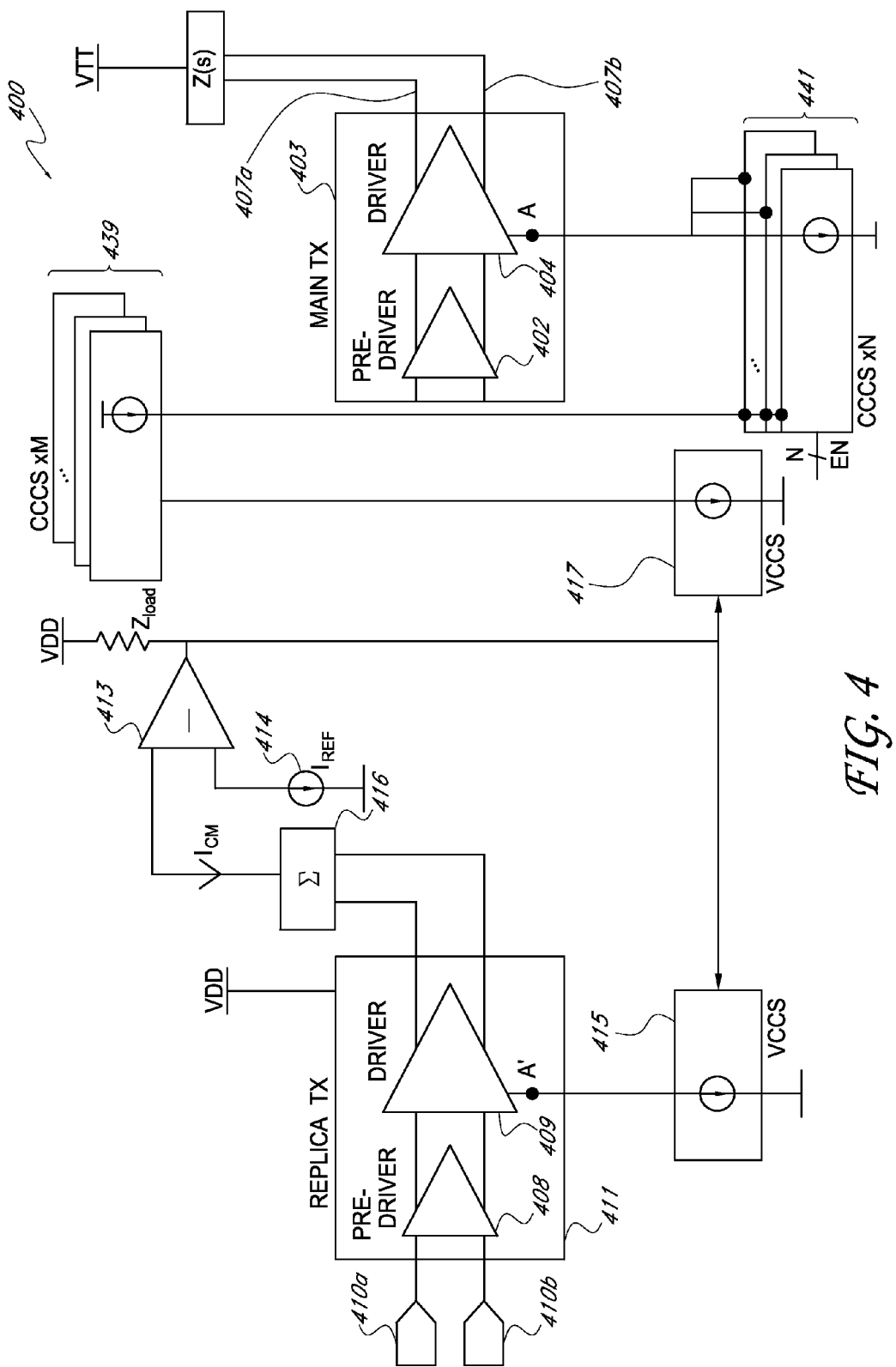
FIG. 4 is a simplified circuit diagram of an embodiment of a bias circuit arrangement.

FIG. 4 is a simplified circuit diagram of another embodiment of a bias circuit arrangement 400. The bias circuit 400 illustrated in FIG. 4 is similar to and adapted from the bias circuit 300e illustrated in FIG. 3E. Elements common to both bias circuits 400, 300e share common reference indicia, and only differences between the bias circuits 400, 300e are described herein for the sake of brevity.

The active circuit array 343 includes two or more active circuits. Each active circuit includes a pre-driver amplifier 402 and a driver amplifier 404 connected in series, which are each configured to receive differential inputs and provide differential outputs. Specifically, the pre-driver amplifier 402 includes differential inputs 405a, 405b, and the driver amplifier 404 includes differential outputs 407a, 407b. The bias mirror 211, illustrated in FIG. 4, is configured as a replica of one active circuit in the active circuit array 343. As such, the bias mirror 211 includes a single pre-driver amplifier 408 and a single driver amplifier 409 connected in series. The pre-driver amplifier 408 includes differential inputs 410a, 410b, and the driver amplifier 409 includes differential outputs received by a summation circuit 416. The error detector 213 of FIG. 3E is configured as a subtractor circuit 413 and a resistive element 412, having a value represented by $Z_{LOAD}$.

The operation of the bias circuit 400 is substantially the same as the bias circuit 200b illustrated in FIG. 2B. An input signal applied to the differential input 405a, 405b of the active circuit may perturb the DC bias conditions of the driver amplifier 404. Accordingly, if the same, similar or an approximation of the input signal is applied to the differential input 410a, 410b of the bias mirror 211, the same, similar or an approximation of the perturbation will occur within the bias mirror 211 as occurs in the driver amplifier 404. The perturbation may in turn have an impact on the current output of the bias mirror 211. Nevertheless, as discussed above, the feedback loop operation of the bias circuit 400 will continuously provide updated bias conditions to bias node A' through the first voltage controllable current source 315 that substantially compensate for the perturbation and stabilize the operating point of the bias mirror 211. The continuously updated bias conditions on bias node A' will also be copied or translated to the bias node A through the second controllable voltage source 317 and first and second current controlled sources 339, 341, where the bias conditions may substantially compensate for the perturbation caused by the input signal and stabilize the operating point of the driver amplifier.

Figure 5:
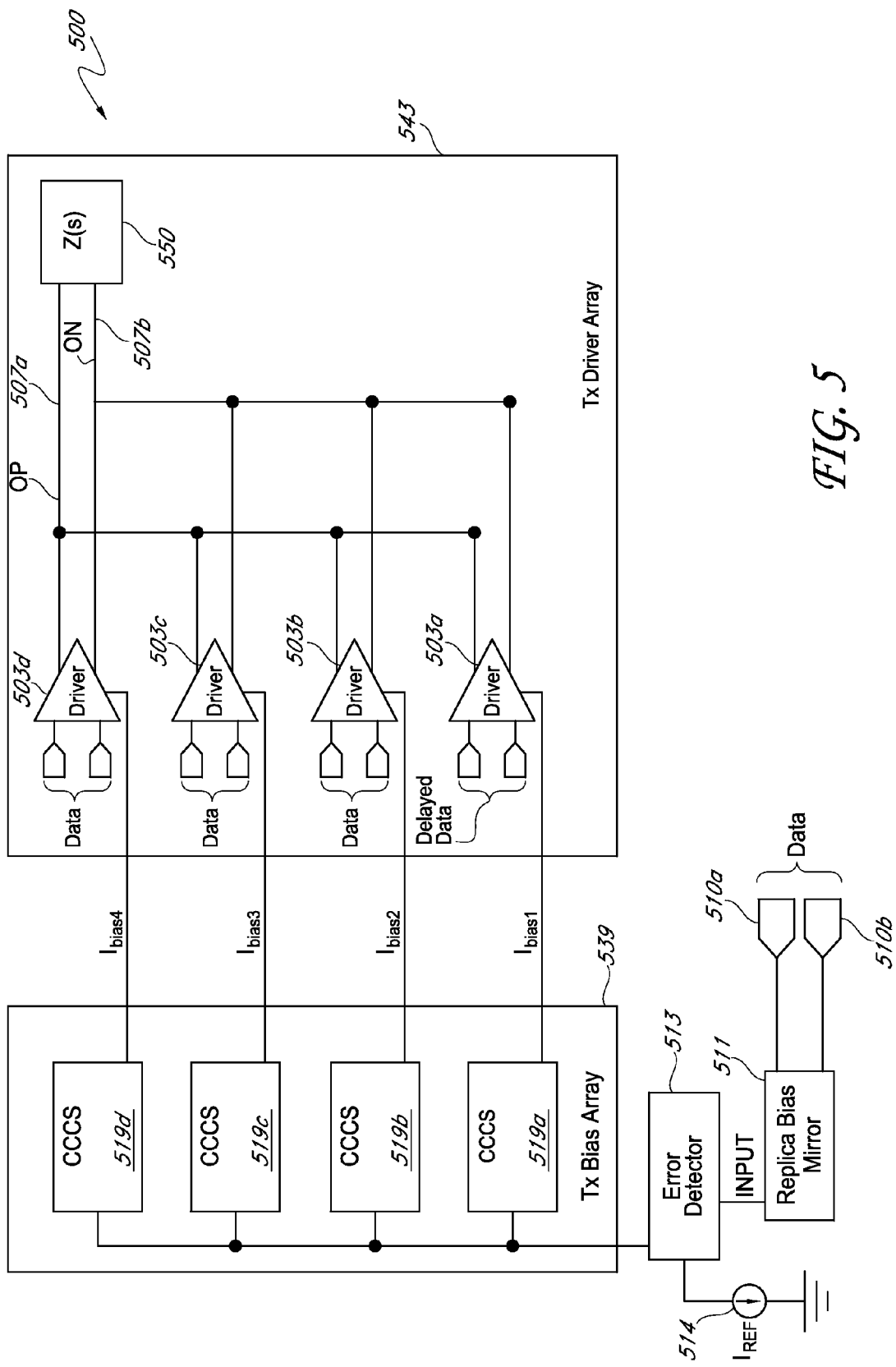
FIG. 5 is a simplified circuit diagram of another embodiment of a bias circuit arrangement.

FIG. 5 is a simplified circuit diagram of another embodiment of a bias circuit 500. The bias circuit 500 includes a transmit bias array 539, an error detector circuit 513, a current source 514 and a replica bias mirror 511. The bias circuit 500 illustrated in FIG. 5 is similar to and adapted from the bias circuit 400 illustrated in FIG. 4, with the exception that the feedback loop configuration is not shown for the sake of simplicity.

The Replica bias mirror includes differential inputs 510a, 510b which allow the replica bias mirror 511 to be perturbed the same, similar or an approximation of the way the active circuits are perturbed by respective inputs. The transmit bias array 539 includes four current controlled current sources 519a, 519b, 519c, 519d that are each coupled to receive a control signal from the error detector 513. Those skilled in the art will appreciate that a transmit bias array may include less or more than four controllable sources, and only four have been illustrated in FIG. 5 as an example. Moreover, those skilled in the art will also appreciate that each controllable source may provide one or more outputs and/or provide differential or single-ended outputs. FIG. 5 also includes a transmit driver array 543 including a complex load 550 and four driver amplifiers 503a, 503b, 503c, 503d. The four driver amplifiers 503a, 503b, 503c, 503d are coupled to the complex load 550 on differential output lines 407a, 407b. Those skilled in the art will appreciate that a transmit driver array may include less or more than four driver amplifiers, and only four have been illustrated in FIG. 5 as an example. Moreover, those skilled in the art will also appreciate that each driver amplifier may provide one or more outputs and/or provide differential or single-ended outputs.

In operation each of the four controllable sources 519a, 519b, 519c, 519d produces a respective current output $I_{bias1}$, $I_{bias2}$, $I_{bias3}$, $I_{bias4}$, which is coupled to a respective one of the four driver amplifiers 503a, 503b, 503c, 503d. Nevertheless, there is only one feedback loop including the error detector 513, the replica bias mirror 511 and current source 514 providing the control signal for the four controllable sources 519a, 519b, 519c, 519d.

Figure 6:
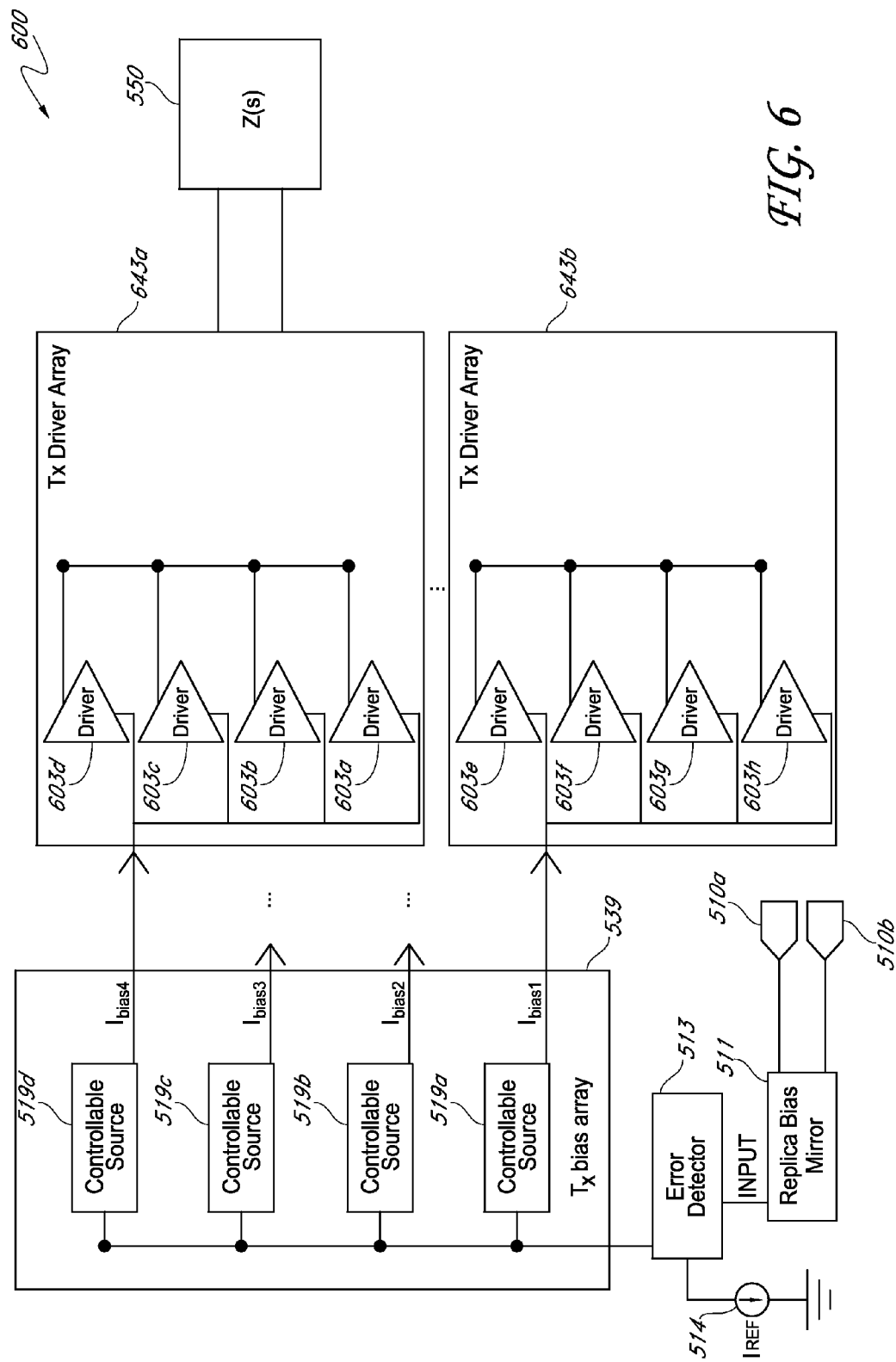
FIG. 6 is a simplified circuit diagram of another embodiment of a bias circuit arrangement.

FIG. 6 is a simplified circuit diagram of another embodiment of a bias circuit arrangement. The bias circuit 600 illustrated in FIG. 6 is similar to the bias circuit 500 illustrated in FIG. 5. FIG. 6 includes first and second transmit driver arrays 643a, 643b. The first transmit driver array 643a includes four driver amplifiers 603a, 603b, 603c, 603d. The second transmit driver array 643b includes four driver amplifiers 603e, 603f, 603g, 603h. The eight driver amplifiers 603a, 603b, 603c, 603d, 603e, 603f, 603g, 603h are coupled to the complex load 550 on differential lines not shown for the sake of simplicity.

In operation each of the four controllable sources 519a, 519b, 519c, 519d produces a respective current output $I_{bias1}$, $I_{bias2}$, $I_{bias3}$, $I_{bias4}$, which is coupled to respective driver amplifiers. As illustrated in FIG. 6, $I_{bias4}$ produced by controllable source 519d is provided to drive amplifiers 603a, 603b, 603c, 603d, and $I_{bias1}$ produced by controllable source 519a is provided to drive amplifiers 603e, 603f, 603g, 603h. Nevertheless, there is only one feedback loop including the error detector 513, the replica bias mirror 511 and current source 514 providing the control signal for the four controllable sources 519a, 519b, 519c, 519d.

Moreover, those skilled in the art will appreciate that a single bias current and/or voltage can be provided to one or more active circuits. Additionally and/or alternatively, those skilled in the art will also appreciate that a single active circuit can receive one or more bias currents and/or voltages.

Figure 7:
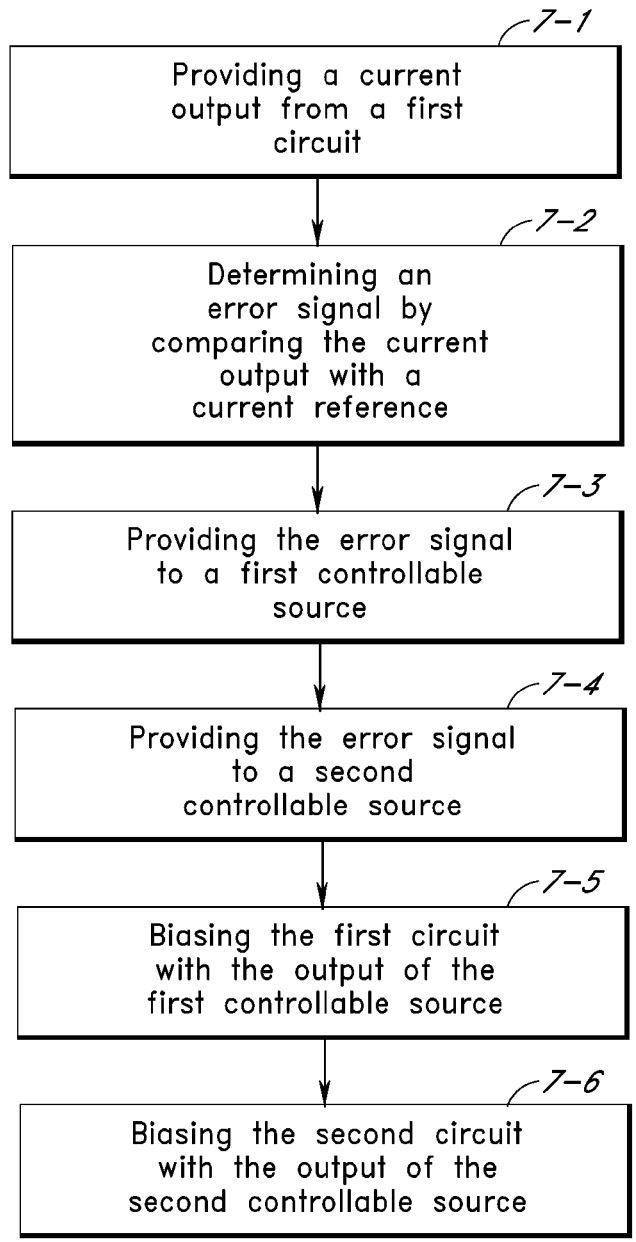
FIG. 7 is a flow chart illustrating a method of providing a bias signal to an active circuit.

FIG. 7 is a flow chart illustrating a method of providing a bias signal to an active circuit. As represented by block 7-1, the method includes providing a current output from a first circuit. As represented by block 7-2, the method includes determining an error signal by comparing the current output with a current reference. As represented by block 7-3, the method includes providing the error signal to a first controllable source as a control input, so that the first controllable source provides a first bias signal. As represented by block 7-4, the method includes providing the error signal to a second controllable source as a control input, so that the second controllable source provides a second bias signal. As represented by block 7-5, the method includes applying the first bias signal to a bias node of the first circuit. As represented by block 7-6, the method includes applying the second bias signal to a bias node of a second circuit.

Numerous inventive principles have been described above, and each has independent utility. In some cases, additional benefits and advantages are realized when the principles are utilized in various combinations with one another. For example, various embodiments of bias circuit arrangements have been described above. Elements of these individual embodiments, however, may be combined with any active circuit. Such an active circuit may be implemented according to the principles and advantages of the embodiments to provide a relatively more robust biasing arrangement for the active circuit.

Some of the embodiments disclosed herein have been described with specific signals implemented as current-mode or voltage mode signals, but the inventive principles also contemplate other types of signals, whether characterized as voltages or currents. Likewise, some semiconductor devices are described as being specifically NPN or PNP BJTs, but in many cases different polarities or different device types such as J-FETs or CMOS transistors can also be utilized.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Moreover, bias circuit arrangements employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, cellular base stations, a telephone, a television, a computer monitor, a computer, a hand-held computer, a personal digital assistant (PDA), a stereo system, a cassette recorder or player, a DVD player, a CD player, a VCR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

Thus, the embodiments described herein can be modified in arrangement and detail without departing from the scope of the appended claims. So although specific embodiments have been described, other embodiments will be apparent to those of ordinary skill in the art from the disclosure herein. For example, a skilled artisan will recognize from the disclosure herein that various methods of manufacture, design, and materials can be used to make the various components described herein. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the specific embodiments described above, but is to be defined by reference to the appended claims.

What is claimed is:

1. An apparatus comprising:
a first circuit configured to contribute to the biasing of a second circuit, the first circuit operatively coupled to a first bias node as a reference for biasing of a second bias node of the second circuit, the first circuit having an output configured to generate a first electrical output;
a first current source configured to provide an electrical reference;
an error detection circuit configured to generate an error signal based at least partly on the electrical reference and the first electrical output of the first circuit;
a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal; and
a second controllable electrical source operatively coupled between the error detection circuit and the second circuit, the second controllable electrical source configured to receive the error signal as a control input and to generate a second electrical output, wherein the second electrical output is generated at least partly in response to the error signal.

2. The apparatus of claim 1, wherein the first circuit has substantially the same configuration of electrical components as the second circuit.

3. The apparatus of claim 1, wherein the electrical reference is substantially invariable.

4. The apparatus of claim 1, wherein the electrical output of the first circuit is a current and the electrical reference is a current reference.

5. The apparatus of claim 4, wherein the error signal is generated as a function of a comparison of the reference current and the current output of the first circuit.

6. The apparatus of claim 4, wherein the current output of the first circuit is a differential current, and the error signal is a voltage signal generated as a function of the difference between the reference current and the summation of the differential current from the first circuit.

7. The apparatus of claim 1, wherein the error signal is a current signal.

8. The apparatus of claim 1, wherein the error signal is a voltage signal.

9. The apparatus of claim 8, wherein the first controllable electrical source is a voltage controlled current source configured to provide a current output in response to the error signal.

10. The apparatus of claim 8, wherein the second controllable electrical source is a voltage controlled current source configured to provide a current output in response to the error signal.

11. The apparatus of claim 10, wherein the current output of the voltage controlled current source is connectable to the second bias node of the second circuit.

12. The circuit of claim 8, wherein the second controllable electrical source comprises a plurality of voltage controlled current sources configured to provide respective current outputs.

13. The apparatus of claim 1, wherein the first and second circuits are configured to receive the same data inputs.

14. The apparatus of claim 1, wherein the first circuit is configured to emulate the operation of at least a portion of the second circuit.

15. The apparatus of claim 14, wherein the first circuit has a substantially different configuration than the second circuit.

16. An apparatus comprising:
a first circuit configured to contribute to the biasing of a second circuit, the first circuit operatively coupled to a first bias node as a reference for biasing of a second bias node of the second circuit, the first circuit having an output configured to generate a first electrical output;
an error detection circuit configured to generate an error signal based at least partly on an electrical reference and the first electrical output of the first circuit;
a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal; and
a second controllable electrical source operatively coupled between the error detection circuit and the second circuit, the second controllable electrical source configured to receive the error signal as a control input and to generate a second electrical output, wherein the second electrical output is generated at least partly in response to the error signal,
wherein the first circuit is a scaled version of the second circuit.

17. An apparatus comprising:
a first circuit configured to contribute to the biasing of a second circuit, the first circuit operatively coupled to a first bias node as a reference for biasing of a second bias node of the second circuit, the first circuit having an output configured to generate a first electrical output;
an error detection circuit configured to generate an error signal based at least partly on an electrical reference and the first electrical output of the first circuit;
a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal; and
a second controllable electrical source operatively coupled between the error detection circuit and the second circuit, the second controllable electrical source configured to receive the error signal as a control input and to generate a second electrical output, wherein the second electrical output is generated at least partly in response to the error signal,
wherein the electrical reference is variable.

18. An apparatus comprising:
a first circuit configured to contribute to the biasing of a second circuit, the first circuit operatively coupled to a first bias node as a reference for biasing of a second bias node of the second circuit, the first circuit having an output configured to generate a first electrical output;
an error detection circuit configured to generate an error signal based at least partly on an electrical reference and the first electrical output of the first circuit;
a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal;
a second controllable electrical source operatively coupled between the error detection circuit and the second circuit, the second controllable electrical source configured to receive the error signal as a control input and to generate a second electrical output, wherein the second electrical output is generated at least partly in response to the error signal,
wherein the second controllable electrical source is a voltage controlled current source configured to provide a current output in response to the error signal, and wherein the error signal is a voltage signal; and
a current controlled current source between the voltage controlled current source and the second bias node of the second circuit, wherein the current controlled current source is configured to provide a current output in response to the current output of the voltage controlled current source.

19. An apparatus comprising:
a first circuit configured to contribute to the biasing of a second circuit, the first circuit operatively coupled to a first bias node as a reference for biasing of a second bias node of the second circuit, the first circuit having an output configured to generate a first electrical output;
an error detection circuit configured to generate an error signal based at least partly on an electrical reference and the first electrical output of the first circuit;
a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal;
a second controllable electrical source operatively coupled between the error detection circuit and the second circuit, the second controllable electrical source configured to receive the error signal as a control input and to generate a second electrical output, wherein the second electrical output is generated at least partly in response to the error signal,
wherein the second controllable electrical source is a voltage controlled current source configured to provide a current output in response to the error signal, and wherein the error signal is a voltage signal; and a first current controlled current source and a second current controlled current source connectable in series between the voltage controlled current source and the second bias node of the second circuit, wherein the first current controlled current source is configured to provide a current output in response to the current output of the voltage controlled current source, and the second current controlled current source is configured to provide a current output in response to the current output of the first current controlled current source.

20. An apparatus comprising:

a first circuit configured to contribute to the biasing of a second circuit, the first circuit operatively coupled to a first bias node as a reference for biasing of a second bias node of the second circuit, the first circuit having an output configured to generate a first electrical output;

an error detection circuit configured to generate an error signal based at least partly on an electrical reference and the first electrical output of the first circuit;

a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal;

a second controllable electrical source operatively coupled between the error detection circuit and the second circuit, the second controllable electrical source configured to receive the error signal as a control input and to generate a second electrical output, wherein the second electrical output is generated at least partly in response to the error signal, wherein the second controllable electrical source is a voltage controlled current source configured to provide a current output in response to the error signal, and wherein the error signal is a voltage signal; and a plurality of current controlled current sources configured to provide respective current outputs, wherein each of the plurality of current controlled current sources is configured to provide a respective current output in response to the current output of the voltage controlled current source.

21. An apparatus comprising:

a first circuit configured to contribute to the biasing of a second circuit, the first circuit operatively coupled to a first bias node as a reference for biasing of a second bias node of the second circuit, the first circuit having an output configured to generate a first electrical output;

an error detection circuit configured to generate an error signal based at least partly on an electrical reference and the first electrical output of the first circuit;

a first controllable electrical source operatively coupled between the error detection circuit and the first circuit, the first controllable electrical source configured to receive the error signal as a control input and to generate a first bias as an input to the first bias node of the first circuit, wherein the first bias is generated at least partly in response to the error signal;

a second controllable electrical source operatively coupled between the error detection circuit and the second circuit, the second controllable electrical source configured to receive the error signal as a control input and to generate a second electrical output, wherein the second electrical output is generated at least partly in response to the error signal, wherein the second controllable electrical source is a voltage controlled current source configured to provide a current output in response to the error signal, and wherein the error signal is a voltage signal;

a first plurality of current controlled current sources, wherein each of the first plurality of current controlled current sources is configured to provide a respective current output in response to the current output of the voltage controlled current source; and a second plurality of current controlled current sources, wherein each of the second plurality of current controlled current sources is configured to provide a respective current output in response to at least one of the respective current outputs of the first plurality of current controlled current sources, wherein one of the at least one of the first plurality of current controlled current sources and the at least one of the second plurality of current controlled current sources is selectively switchable between an activated and deactivated state.

22. The apparatus of claim 21 wherein one of the at least one of the first plurality of current controlled current sources and the at least one of the second plurality of current controlled current sources includes an enable input that configured to switch the current controlled current source between the activated and deactivated state.

23. The apparatus of claim 21, further comprising a control circuit for selectively activating and deactivating at least one of the first plurality of current controlled current sources and at least one of the second plurality of current controlled current sources.

24. The apparatus of claim 21, further comprising a plurality of second circuits, wherein each of the plurality of second circuits is substantially the same as the others, each of the plurality of second circuits includes a respective second bias node, and wherein the respective plurality of second bias nodes are configured to receive at least one of the respective current outputs from the second plurality of current controlled current sources.

25. The apparatus of claim 24, wherein at least one of the second plurality of current controlled current sources provides a single respective current output to two or more of the plurality of second circuits.

26. The apparatus of claim 24, wherein at least one of the second circuits is configured to receive two or more respective current outputs from the second plurality of current controlled current sources.

27. A method for generating a bias for an electronic circuit, the method comprising:

generating a first electrical output from a first circuit;

generating an electrical reference from a first current source;

generating an error signal based at least partly on a comparison between the first electrical signal and the electrical reference;

generating a first bias by providing the error signal as a control input to a first controllable source;

applying the first bias to a bias node of the first circuit;

generating a second bias by providing the error signal as a control input to a second controllable source; and applying the second bias to a bias node of a second circuit for biasing of the second circuit.

28. An apparatus for generating a bias for an electronic circuit, the apparatus comprising:

means for generating a first electrical output from a first circuit;

means for generating an electrical reference from a first current source;
means for generating an error signal based at least partly on a comparison between the first electrical signal and the electrical reference;
means for generating a first bias by providing the error signal as a control input to a first controllable source, wherein the first bias is applied to a bias node of the first circuit; and
means for generating a second bias by providing the error signal as a control input to a second controllable source, wherein the second bias is applied to a bias node of a second circuit for biasing of the second circuit.

* * * * *